United States Patent
Andre et al.

(10) Patent No.: US 6,507,305 B2
(45) Date of Patent: Jan. 14, 2003

(54) PIPELINED ANALOG-TO-DIGITAL CONVERTER WITH NOISE SHAPING

(75) Inventors: Eric Andre, Seyssins (FR); Frédéric Paillardet, Aix les Bains (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/855,746

(22) Filed: May 16, 2001

(65) Prior Publication Data

US 2002/0024459 A1 Feb. 28, 2002

(30) Foreign Application Priority Data

May 16, 2000 (FR) .............................. 00 06198

(51) Int. Cl.[7] .............................................. H03M 1/38
(52) U.S. Cl. ..................... 341/161; 341/155; 341/156; 341/158; 341/162; 341/161; 341/172; 341/163; 341/137; 341/143; 341/144; 341/116
(58) Field of Search ................................. 341/161, 143, 341/163, 172, 156, 158, 155, 144

(56) References Cited

U.S. PATENT DOCUMENTS

| | | | | |
|---|---|---|---|---|
| 4,684,924 A | * | 8/1987 | Wood | 341/156 |
| 4,894,657 A | * | 1/1990 | Hwang et al. | 341/155 |
| 5,043,732 A | * | 8/1991 | Robertson et al. | 341/161 |
| 5,068,661 A | * | 11/1991 | Kaneaki et al. | 341/143 |
| 5,124,705 A | * | 6/1992 | Voorman | 341/143 |
| 5,181,032 A | * | 1/1993 | Ribner | 341/155 |
| 5,742,246 A | * | 4/1998 | Kuo et al. | 341/143 |
| 5,771,012 A | * | 6/1998 | Shu et al. | 341/118 |
| 5,838,272 A | * | 11/1998 | Steiner et al. | 341/143 |
| 5,990,820 A | * | 11/1999 | Tan | 341/161 |
| 6,166,675 A | * | 12/2000 | Bright | 341/162 |
| 6,285,309 B1 | * | 9/2001 | Yu | 341/161 |

FOREIGN PATENT DOCUMENTS

WO 00/08765 2/2000

OTHER PUBLICATIONS

Brooks et al.; A Cascaded Sigma–Delta Pipeline A/D Converter with 1.25 MHz Signal Bandwidth and 89 dB SNR; IEEE Journal of Solid–State Circuits, vol. 32, No. 12, 1997 XP–000767440; pp. 1896–1906.

* cited by examiner

*Primary Examiner*—Michael Tokar
*Assistant Examiner*—Lam T. Mai
(74) *Attorney, Agent, or Firm*—Jacobson Holman PLLC

(57) ABSTRACT

An analog-to-digital converter including a first module of the type having a series of processor stages, each of the stages performing two conversions of the signal output by the preceding stage, firstly an analog-to-digital conversion and secondly a digital-to-analog conversion, followed by subtracting the signal obtained from the output signal of the preceding stage to provide the analog output signal of the stage. The first module further assembles together the signals digitized by each stage ($S_1, \ldots, S_i$) so as to provide an assembled digital signal ($S_N(nT)$) which represents the input signal (e(nT)) of the converter in digital form. The converter further includes a $\Delta\Sigma$ modulator which digitizes the output signal (b(nT)) from one of the stages, the resulting digitized signal being subtracted from the assembled digital signal ($S_N(nT)$)

13 Claims, 2 Drawing Sheets

PIPELINED ANALOG-TO-DIGITAL CONVERTER WITH NOISE SHAPING

BACKGROUND OF THE INVENTION

1. Field of the Invention

The invention relates to analog-to-digital converters (ADCs).

2. Description of the Related Art

There are two large families of analog-to-digital converters: broad band ADCs (several MHz) with medium resolution (up to 10 significant bits), and narrow band ADCs (a few kHz) with high resolution (up to 16 bits and more).

Pipelined analog-to-digital conversion and $\Delta\Sigma$ modulation are to be found in numerous techniques known in the field of analog-to-digital conversion. Pipelined ADCs generally have a broad passband (several MHz) and medium resolution: of the order of 8 to 10 significant bits. In contrast, $\Delta\Sigma$ modulators are used to convert signals with high resolution (up to 16 bits and more) but over a frequency band that is generally narrow (a few kHz).

A pipelined converter comprises individual analog-to-digital conversion stages which are disposed in a pipeline. Each stage of the pipeline provides a number of bits which contribute to digitally encoding the signal. The operating principle of a pipeline stage consists in digitizing its input signal on a small number of bits by means of a flash type converter. Thereafter the digital code is converted back into an analog signal prior to being subtracted from the input signal (see FIG. 1). The resulting difference is referred to as the "residue". Each stage of the pipeline processes the residue of the preceding stage (except for the first stage which receives the input signal), and delivers a new residue to the following stage.

The precision of the components used limit the number of stages and the resolution of a pipelined analog-to-digital converter. However that technique has the advantage of a conversion bandwidth that can be as great as several MHz.

A $\Delta\Sigma$ analog-to-digital converter comprises a $\Delta\Sigma$ modulator followed by a decimator. The $\Delta\Sigma$ modulator oversamples the input signal and rejects quantization noise to outside the working bandwidth. The decimator operates in the digital domain to filter out the shaped quantization noise and reduces the output signal rate to the Nyquist frequency.

Because of the oversampling and the quantization noise shaping, $\Delta\Sigma$ modulation makes it possible to achieve high performance. However the conversion bandwidth is generally limited to a few kHz.

SUMMARY OF THE INVENTION

The object of the present invention is to propose an analog-to-digital converter that has high resolution over a selected frequency band while nevertheless retaining acceptable performance outside the selected band.

According to the invention, this object is achieved by an analog-to-digital converter including a first module of the type comprising a series of processor stages, each of said stages performing two conversions of the signal output by the preceding stage, firstly an analog-to-digital conversion and secondly a digital-to-analog conversion, followed by subtracting the signal obtained in this way from the output signal of the preceding stage to provide the analog output signal of said stage, said first module further including means for assembling together the signals digitized by each stage so as to provide an assembled digital signal which represents the input signal of the converter in digital form, the converter being characterized in that it further includes a $\Delta\Sigma$ modulator which digitizes the output signal from one of said stages, and means for subtracting the signal as digitized in this way from said assembled digital signal.

According to the invention this object is also achieved by a method of performing analog-to-digital conversion on an input signal to obtain an output signal in which a series of processing steps are performed, in each of which two conversions are performed on a result signal from the preceding step, firstly an analog-to-digital conversion and then a digital-to-analog conversion, followed by subtraction of the analog signal obtained in this way from the result signal of the preceding step to supply the result signal of the current step, in which method the signals digitized at each step are assembled together to form an assembled digital signal which represents the input signal in digital form, the method being characterized in that the result signal of one of said steps is also digitized by means of a $\Delta\Sigma$ modulator and this digitized signal is subtracted from said assembled digital signal.

BRIEF DESCRIPTION OF THE DRAWINGS

Other objects, advantages, and characteristics of the invention will appear on reading the following detailed description made with reference to the accompanying drawings, in which.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The residue delivered by the last stage of a pipelined analog-to-digital converter 100 corresponds to the quantization noise of the pipelined converter such that:

$$b(nT) = s_N(nT) - e(nT)$$

where $b(nT)$ is the quantization noise of the pipelined ADC, $s_N(nT)$ is the digital output signal, and $e(nT)$ is the analog input signal to the converter.

Figure 1:
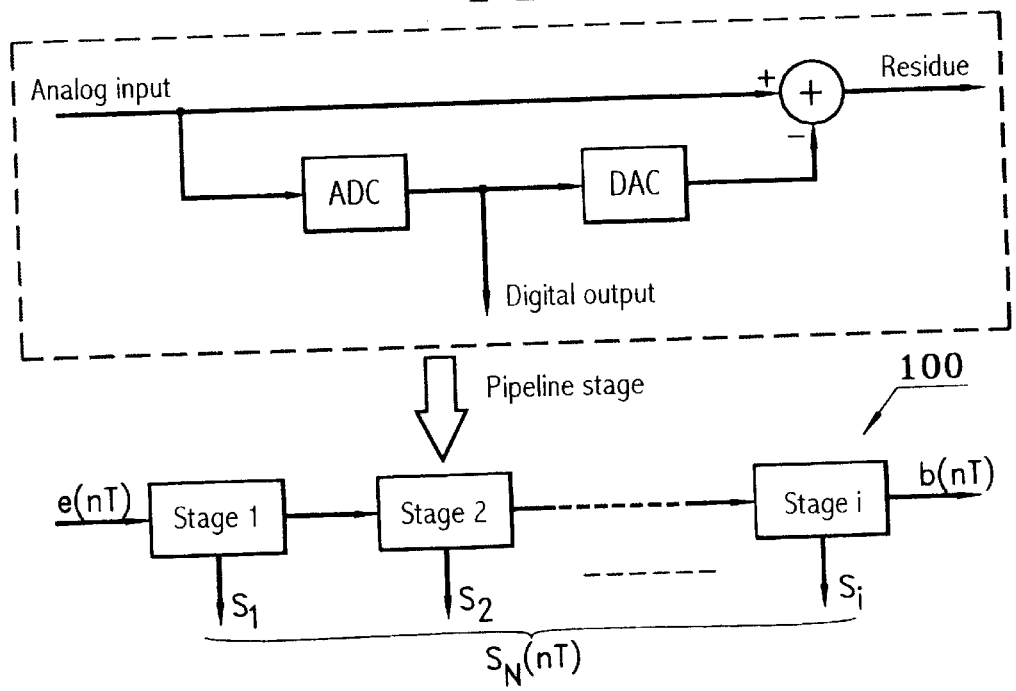
FIG. 1 shows a prior art pipelined type of analog-to-digital converter.
Figure 2:
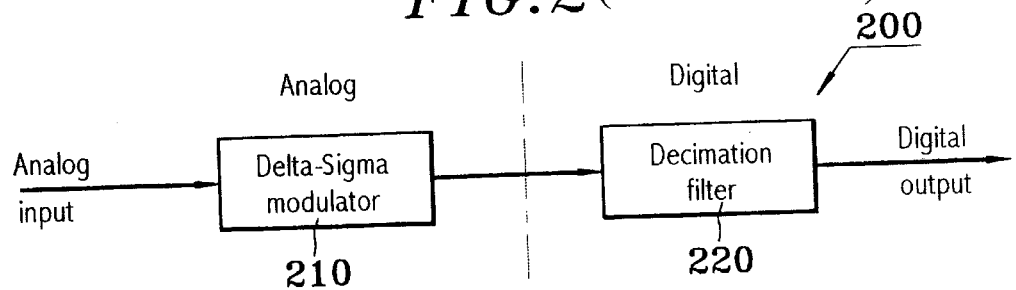
FIG. 2 shows a prior art $\Delta\Sigma$ converter.
Figure 3:
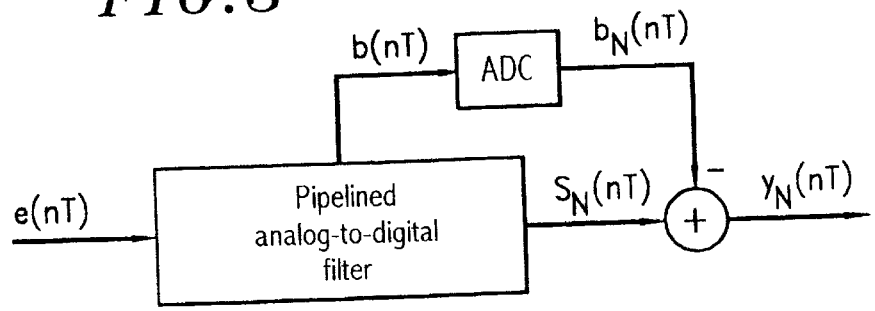
FIG. 3 shows an analog-to-digital converter in which a pipelined converter is associated with an additional analog-to-digital converter placed at its output.
Figure 4:
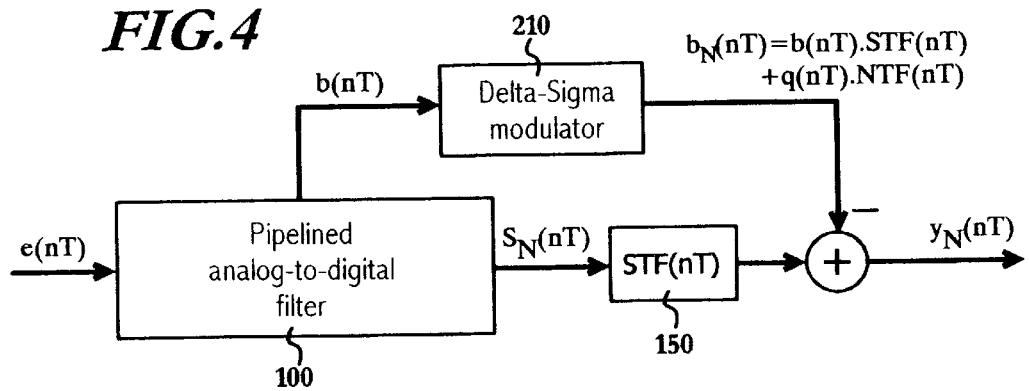
FIG. 4 shows an analog-to-digital converter of the invention.

In the present device as described and shown in FIGS. 3 and 4, the error signal $b(nT)$ is digitized in order to enable it to be subtracted from the digital output signal $s_N(nT)$ such that:

$$s_N(nT) = e(nT) + b(nT) - b_N(nT)$$

where $b_N(nT)$ represents $b(nT)$ in the digital domain. The greater the accuracy of this representation, the better the performance that an analog-to-digital converter using the proposed system will provide. Ideally $b_N(nT) = b(nT)$.

In order to have high accuracy for $b_N(nT)$, the system proposed uses a $\Delta\Sigma$ modulator 210. This modulator 210 increases the performance of the pipelined analog-to-digital converter 100 over a portion of its conversion band.

The characteristics of the $\Delta\Sigma$ modulator 210 used determine simultaneously the increase in performance, the width of the higher performance conversion band, and the overall complexity of the system.

The signal $b_N(nT)$ delivered by the $\Delta\Sigma$ modulator 210 comprises the digital signal b(nT) multiplied by a signal transfer function STF(nT) and new quantization noise q(nT) multiplied by a noise shaping transfer function NTF(nT) specific to the $\Delta\Sigma$ modulator 210 used.

In conventional manner, a $\Delta\Sigma$ modulator has two transfer functions, one of which is seen by the input signal to the modulator, and the other of which is seen by the quantization noise (noise transfer function NTF(nT)).

A module 150 applies a transfer function which is the same as the function seen by the input signal to the $\Delta\Sigma$ modulator 210.

Before subtracting the signal $b_N(nT)$ from $s_N(nT)$, $s_N(nT)$ is therefore multiplied in the module 150 by the signal transfer function STF(nT) specific to the $\Delta\Sigma$ modulator. This provides a signal $y_N(nT)$ such that:

$$y_N(nT)=s_N(nT).STF(nT)-[b(nT).STF(nT)+q(nT).NTF(nT)]$$

It is necessary for the other one of these two signals which are subtracted from each other to have been likewise processed by said transfer function in order to achieve optimum efficiency.

In general, the signal transfer function is made up solely of one or more delays and in order to simplify computation, it is assumed that STF(nT)=1 (ignoring delay):

$$y_n(nT)=e(nT)-q(nT).NTF(nT)$$

Thus, the new digital signal obtained with the proposed system comprises the image of the input signal having superposed thereon quantization noise of power which is reduced in a given frequency band.

By using $\Delta\Sigma$ modulation (shaping quantization noise), the performance of the ADC is improved, but only over a fraction of its conversion band. A decimation digital filter 220 is then necessary to eliminate the quantization noise rejected outside the conversion band.

The proposed system has been modelled and simulated on a signal processor tool. To validate the original idea, an 8-bit pipelined analog-to-digital converter 100 and a 4th-order 1-bit passband $\Delta\Sigma$ modulator 210 were selected. The working frequency was 40 MHz. The proposed system was tested by applying a sinewave signal at a frequency of 6.7 MHz.

Figure 5:
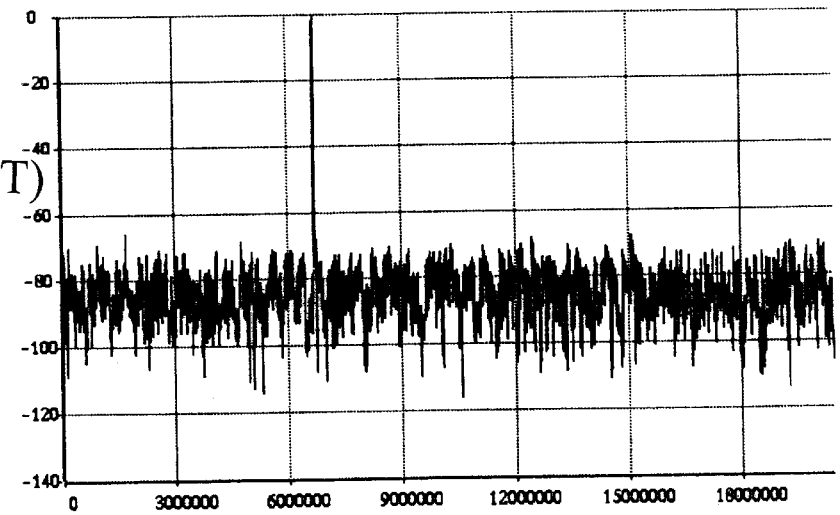
FIG. 5 is a plot representing the output signal from a prior art pipelined analog-to-digital converter.

FIG. 5 shows the output signal from the 8-bit pipelined ADC 100 (conventional operation) over a 20 MHz conversion band. The performance of the ADC 100 in terms of signal-to-noise ratio (SNR) was 50 dB (8 bits) over a band of 20 MHz and 70 dB (nearly 12 significant bits) over a 200 kHz band around the signal (6.58 MHz 6.78 MHz).

Figure 6:
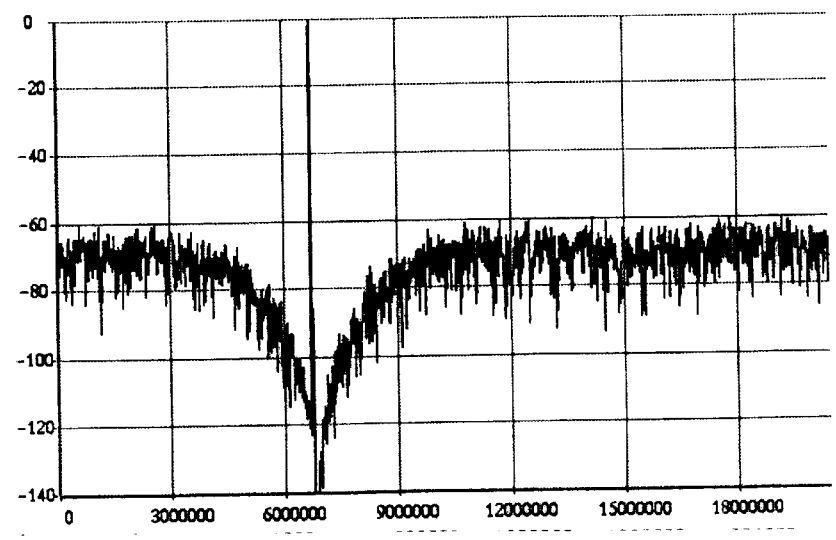
FIG. 6 is a plot representing the output signal from a pipelined analog-to-digital converter of the invention.

FIG. 6 shows the output signal from the proposed system (functionally optimized) over a 20 MHz band. In a 200 kHz band around the signal (6.58 MHz–6.78 MHz), the signal-to-noise ratio was 109 dB (about 18 significant bits).

The proposed system thus makes it possible to increase the performance of a pipelined analog-to-digital converter over a given frequency band by using a $\Delta\Sigma$ modulator (and a digital signal processing function). The modulator digitizes the residue of the last stage of the pipeline with great accuracy so as to reduce the power of the quantization noise in a given frequency band.

The present description thus also covers an analog-to-digital conversion method of the pipelined type in which the residual quantization noise is processed by a $\Delta\Sigma$ modulator so as to optimize performance over a given frequency band.

By means of the device described herein, it is also possible to adapt the performance of an analog-to-digital converter to a selected working conversion band.

If a broad conversion band is necessary, then means not shown in the figures can be provided to deactivate the $\Delta\Sigma$ modulator 210 (such means could be constituted merely by a switch), in which case the ADC will operate in its conventional pipelined mode.

If higher performance is required over a narrower bandwidth, then the $\Delta\Sigma$ modulator 210 is activated. More generally, the proposed system makes it possible to optimize the performance of an ADC around a selected working band by connecting an appropriate $\Delta\Sigma$ modulator to the ADC, e.g. by connecting a lowpass or a bandpass $\Delta\Sigma$ modulator, as required, using conventional connection means.

This option of selecting a $\Delta\Sigma$ modulator is thus available not only when manufacturing the device, but also while it is in use, providing the device is fitted with a plurality of modulators and switching means for selecting which modulator is to be associated with the pipelined ADC.

Such a system is particularly suitable for multimode communications terminals where the components used in the receiver system must be capable of reconfiguring as a function of the selected application so as to share hardware resources. Such terminals are used in particular in telecommunication by means of radio waves, in particular in the field of telephony.

The invention being thus described, it will be apparent that the same may be varied in many ways. Such variations are not to be regarded as a departure from the spirit and scope of the invention, and all such modifications as would be recognized by one skilled in the art are intended to be included within the scope of the following claims.

What is claimed is:

1. An analog-to-digital converter comprising a first module having a series of processor stages, each of said stages performing two conversions of a signal output by a preceding stage, firstly an analog-to-digital conversion and secondly a digital-to-analog conversion, followed by subtracting the signal obtained from the output signal of said preceding stage to provide an analog output signal of said stage, said first module further including means for assembling together signals digitized by each stage $(S_1, \ldots, S_i)$ so as to provide an assembled digital signal $(S_N(nT))$ which represents an input signal (e(nT)) of the converter in digital form, said converter further including a $\Delta\Sigma$ modulator which digitizes an output signal (b(nT)) from one of said stages, and means for subtracting the signal as digitized from said assembled digital signal $(S_N(nT))$.

2. The converter according to claim 1, wherein said means for subtracting said signal as digitized from said assembled digital signal $(S_N(nT))$ include means for implementing treatment on the assembled signal corresponding to a transfer function (STF(nT)) of the $\Delta\Sigma$ modulator as applied to the input signal of the $\Delta\Sigma$ modulator.

3. The converter according to claim 1, wherein said $\Delta\Sigma$ modulator is placed at an output from a last stage of said first module.

4. The converter according to claim 1, further including means for deactivating the $\Delta\Sigma$ modulator.

5. The converter according to claim 1, wherein said converter has a plurality of $\Delta\Sigma$ modulators, each suitable for digitizing an output signal of one of said stages, and switch means for activating a selected one of said $\Delta\Sigma$ modulators.

6. The converter according to claim 1, wherein said converter includes a decimation filter placed downstream from said means for assembling the signals digitized by each stage.

7. A method of performing analog-to-digital conversion on an input signal (e(nT)) to obtain an output signal ($Y_N$(nT)) comprising the steps of:

performing a series of processing steps, in each or which two conversions are performed on a result signal from a preceding step, firstly an analog-to-digital conversion and then a digital-to-analog conversion;

subtracting an analog signal obtained from the result signal of said preceding step to supply the result signal of the current step;

assembling together signals digitized at each step ($S_1, \ldots, S_i$) to form a digital signal ($S_N(nT)$) which represents the input signal ($e(nT)$) in digital form;

digitizing the result signal of one of said steps ($b(nT)$) by means of a $\Delta\Sigma$ modulator; and subtracting the digitized signal ($b_N(nT)$) from said assembled digital signal ($S_N(nT)$).

8. An analog-to-digital converter comprising a first module having a series of processor stages, each of said stages performing two conversions of a signal output by a preceding stage, firstly an analog-to-digital conversion and secondly a digital-to-analog conversion, followed by subtracting the signal obtained from the output signal of said stage, said first module further including means for assembling together signals digitized by each stage ($S_1, \ldots, S_i$), so as to provide an assembled digital signal ($S_N(nT)$) which represents and input signal ($e(nT)$) on the converter in digital form, said converter further including a $\Delta\Sigma$ modulator which digitizes an output signal ($b(nT)$) from one of said stages, and means for subtracting the signal as digitized from said assembled digital signal ($S_N(nT)$), said means for subtracting said signal as digitized from said assembled digital signal ($S_N(nT)$) including means for implementing treatment of the assembled signal corresponding to the transfer function ($STF(nT)$) of the $\Delta\Sigma$ modulator as applied to the input signal of the $\Delta\Sigma$ modulator.

9. An analog-to-digital converter comprising a first module having a series of processor stages, each of said stages performing two conversions of a signal output by a preceding stage, firstly an analog-to-digital conversion and secondly a digital-to-analog conversion, followed by subtracting the signal obtained from the output signal of said preceding stage to provide an analog output signal of said stage, said first module further including means for assembling together signals digitized by each stage ($S_1, \ldots S_i$), so as to provide an assembled digital signal ($S_N(nT)$) which represents an input signal ($e(nT)$) of the converter in digital form, said converter further including a $\Delta\Sigma$ modulator which digitizes an output signal ($b(nT)$) from one of said stages, and means for subtracting the signal as digitized from said assembled digital signal ($S_N(nT)$), the $\Delta\Sigma$ modulator being placed at an output from a last stage of said first module.

10. An analog-to-digital converter comprising a first module having a series of processor stages, each of said stages performing two conversions of a signal output by a preceding stage, firstly an analog-to-digital conversion and secondly a digital-to-analog conversion, followed by subtracting the signal obtained from the output signal of said preceding stage to provide an analog output signal of said stage, said first module further including means for assembling together signals digitized by each stage ($S_1, \ldots S_i$), so as to provide an assembled digital signal ($S_N(nT)$) which represents an input signal ($e(nT)$) of the converter in digital form, said converter further including a $\Delta\Sigma$ modulator which digitizes an output signal ($b(nT)$) from one of said stages, and means for subtracting the signal as digitized from said assembled digital signal ($S_N(nT)$), the analog-to-digital converter including means for deactivating the $\Delta\Sigma$ modulator.

11. An analog-to-digital converter comprising a first module having a series of processor stages, each of said stages performing two conversions of a signal output by a preceding stage, firstly an analog-to-digital conversion and secondly a digital-to-analog conversion, followed by subtracting the signal obtained from the output signal of said preceding stage to provide an analog output signal of said stage, said first module further including means for assembling together signals digitized by each stage ($S_1, \ldots S_i$), so as to provide an assembled digital signal ($S_N(nT)$) which represents an input signal ($e(nT)$) of the converter in digital form, said converter further including a $\Delta\Sigma$ modulator which digitizes an output signal ($b(nT)$) from one of said stages, and means for subtracting the signal as digitized from said assembled digital signal ($S_N(nT)$), the analog-to-digital converter further including a plurality of $\Delta\Sigma$ modulators, each suitable for digitizing an output signal of one of said stages, and switch means for activating a selected one of said $\Delta\Sigma$ modulators.

12. A communication terminal including means for selecting a signal transmission or reception frequency band, the terminal comprising an analog-to-digital converter including a first module having a series of processor stages, each of said stages performing two conversions of a signal output by a preceding stage, firstly an analog-to-digital conversion and secondly a digital-to-analog conversion, followed by subtracting the signal obtained from the output signal of said preceding stage to provide an analog output signal of said stage, said first module further including means for assembling together signals digitized by each stage ($S_1, \ldots S_i$), so as to provide an assembled digital signal ($S_N(nT)$) which represents an input signal ($e(nT)$) of the converter in digital form, said converter further including a $\Delta\Sigma$ modulator which digitizes an output signal ($b(nT)$) from one of said stages, and means for subtracting the signal as digitized from said assembled digital signal ($S_N(nT)$).

13. A method of performing analog-to-digital conversion on an input signal ($e(nT)$) to obtain an output signal ($y_N(nT)$) comprising:

performing a series of processing steps, in each of which two conversions are performed on a result signal from a preceding step, firstly an analog-to-digital conversion and then a digital-to-analog conversion;

subtracting an analog signal obtained from the result signal of said preceding step to supply a result signal of the current step;

assembling together signals digitized at each step ($S1, \ldots, Si$) to form a digital signal ($S_N(nT)$) which represents the input signal ($e(nT)$) in digital form;

digitizing the result signal of one of said steps ($b(nT)$) by means of a $\Delta\Sigma$ modulator;

subtracting the digitized signal ($b_N(nT)$) from said assembled digital signal ($S_N(nT)$); and processing the assembled signal ($S_N(nT)$), which processing corresponds to a transfer function ($STF(nT)$) of the $\Delta\Sigma$ modulator which is applied to the input signal of said $\Delta\Sigma$ modulator.

* * * * *